(12) United States Patent
Jitaru

(10) Patent No.: US 6,731,523 B2
(45) Date of Patent: May 4, 2004

(54) MODULARIZED POWER SUPPLY

(75) Inventor: Ionel Jitaru, Tucson, AZ (US)

(73) Assignee: Ascom Energy Systems AG, Berne (CH)

( * ) Notice: Subject to any disclaimer, the term of this patent is extended or adjusted under 35 U.S.C. 154(b) by 0 days.

(21) Appl. No.: 09/737,500

(22) Filed: Dec. 13, 2000

(65) Prior Publication Data

US 2001/0040812 A1 Nov. 15, 2001

Related U.S. Application Data

(63) Continuation-in-part of application No. 09/310,627, filed on May 12, 1999.

(51) Int. Cl.$^7$ ............................................. H02M 7/23
(52) U.S. Cl. .................................................... 363/65
(58) Field of Search ........................... 363/65, 67, 68, 363/69, 70, 71

(56) References Cited

U.S. PATENT DOCUMENTS

| | | | | | |
|---|---|---|---|---|---|
| 4,425,613 | A | * | 1/1984 | Shelly | 363/26 |
| 5,311,419 | A | * | 5/1994 | Shires | 363/65 |
| 5,530,635 | A | * | 6/1996 | Yashiro | 363/65 |
| 5,936,318 | A | | 8/1999 | Weiler et al. | |
| 5,969,965 | A | | 10/1999 | Byrne et al. | |
| 6,014,322 | A | * | 1/2000 | Hihashi et al. | 363/65 |
| 6,097,616 | A | * | 8/2000 | Iwasaki | 363/97 |
| 6,166,934 | A | * | 12/2000 | Kajouke et al. | 363/65 |
| 6,198,642 | B1 | * | 3/2001 | Kociecki | 363/37 |

FOREIGN PATENT DOCUMENTS

| | | |
|---|---|---|
| DE | 197 04 662 A1 | 8/1998 |
| EP | 0 881 735 A2 | 2/1998 |
| EP | 0 860 926 A2 | 8/1998 |
| EP | 0 860 926 A3 | 8/1998 |
| JP | 07222456 | 8/1995 |
| JP | 09275679 | 10/1997 |

* cited by examiner

*Primary Examiner*—Adolf D. Berhane
(74) *Attorney, Agent, or Firm*—Birdwell, Janke & Durando, PLC

(57) ABSTRACT

A modular power supply. A plurality of power supply modules and a system control circuit for controlling the power supply modules are provided. Each power supply module has a power circuit coupled to a power input of the module for receiving an input power current and produces an output power current at a power output of the module. The power circuits each include at least one switching element for switching the input power current or the output power current of a module. The power circuits further include a control circuit input that is coupled directly to the respective said switching device. The system control circuit includes a control circuit output bus for connecting to the control circuit inputs of each of the power modules and provides a respective signal to each module for directly controlling the respective switching devices.

12 Claims, 18 Drawing Sheets

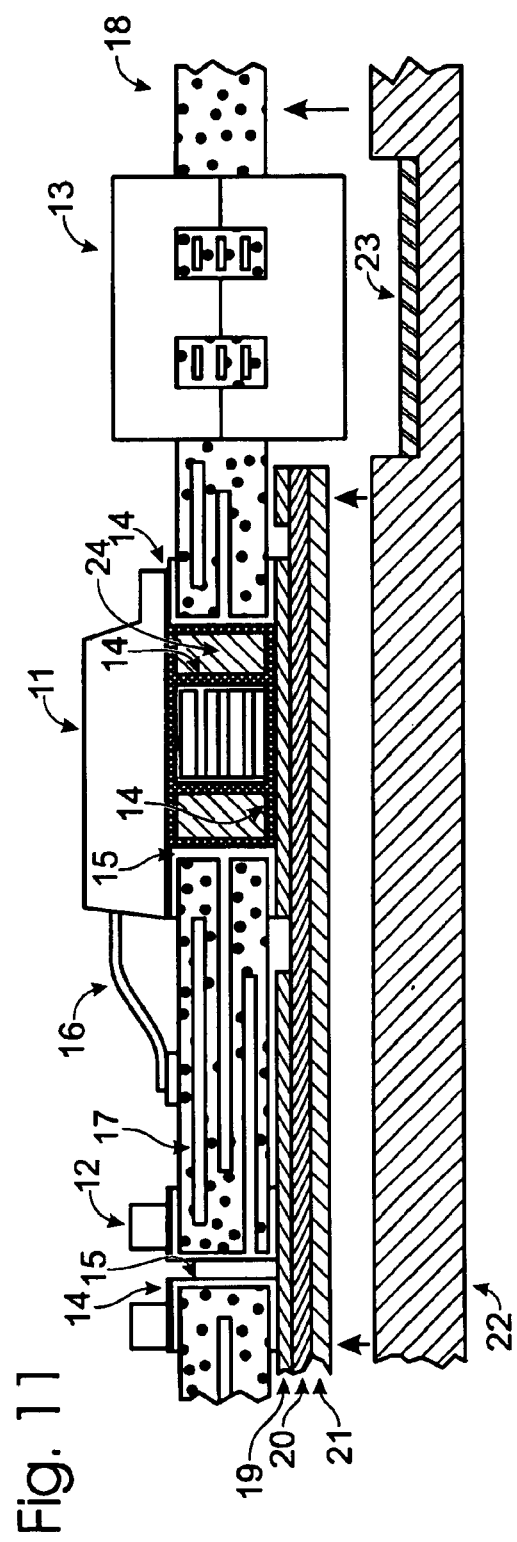
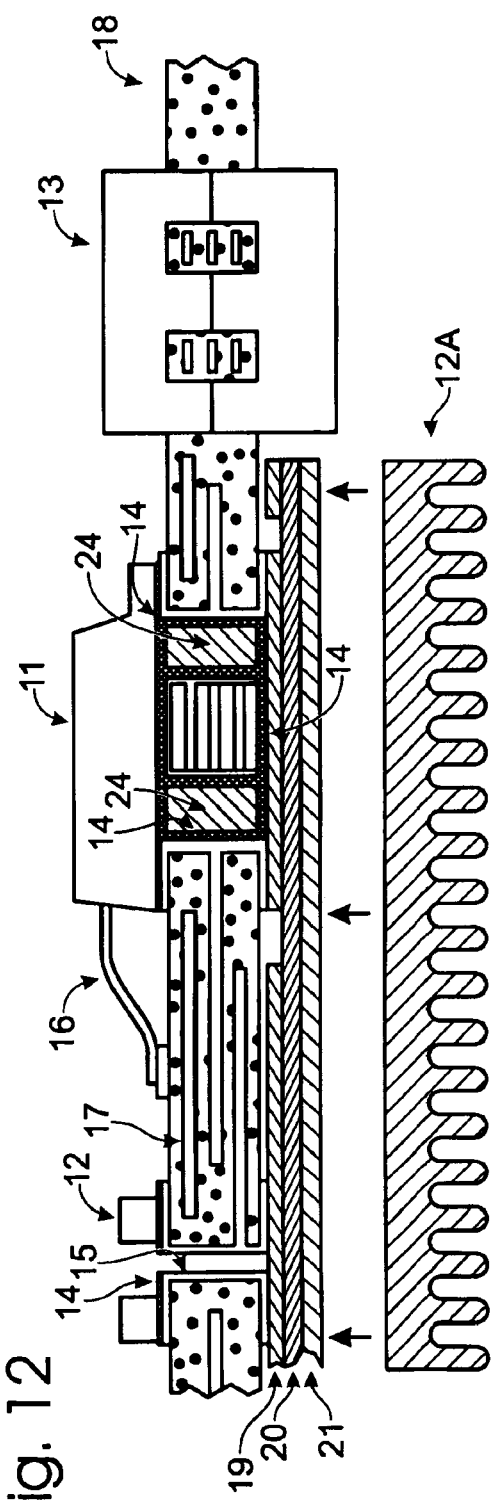

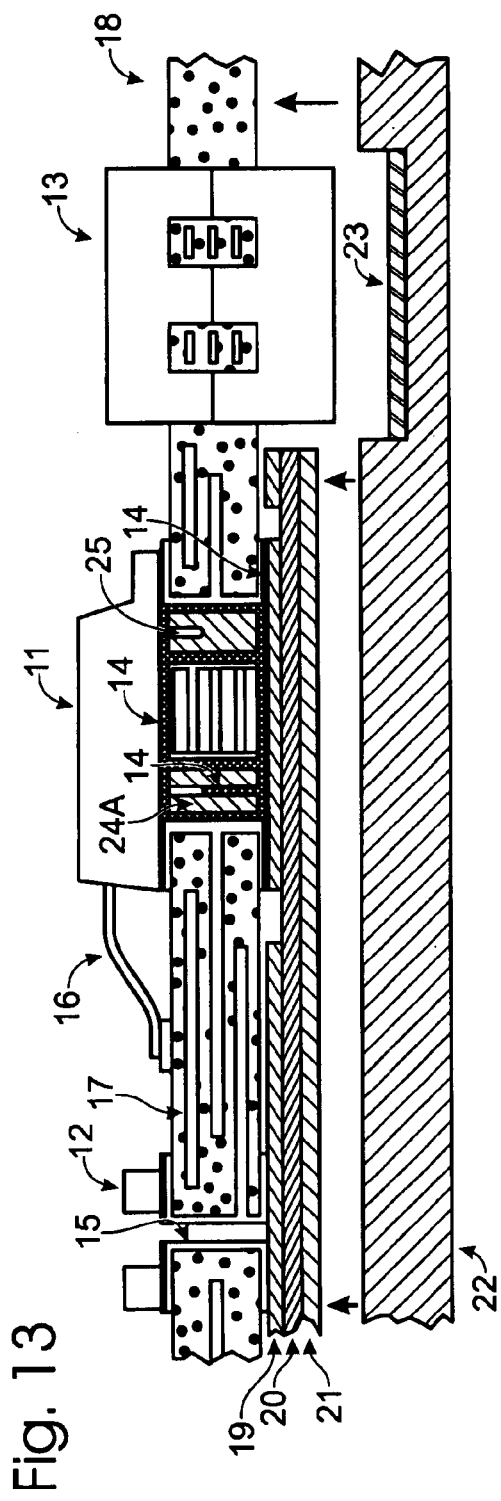
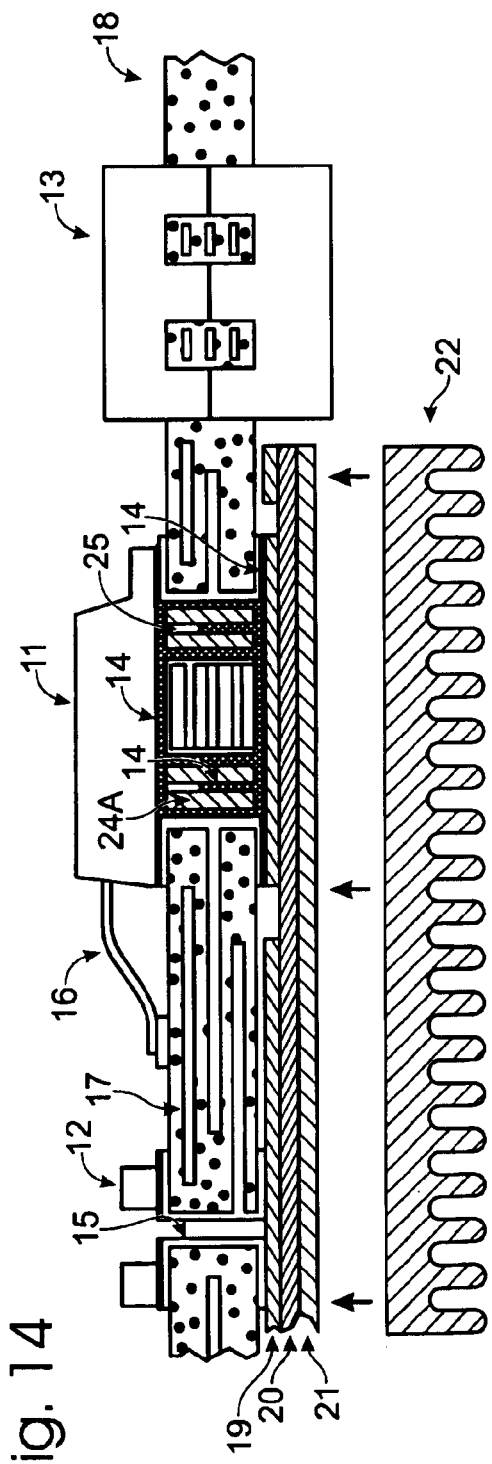
Fig. 13
Fig. 14

MODULARIZED POWER SUPPLY

This application is a continuation-in-part of the inventor's prior application Ser. No. 09/310,627, filed May 12, 1999 now pending, and incorporated by reference herein in its entirety.

BACKGROUND OF THE INVENTION

The present invention relates to a modularized power supply.

Power supplies require power processing circuitry (hereinafter "power circuitry") and control and conditioning circuitry for controlling and conditioning the power processed by the power processing circuitry. The power circuitry typically includes a transformer, a rectifier, switching elements, and power sensing elements, and is alternatively referred to herein as a "power train." The control and conditioning circuitry typically includes an input filter, a bias supply, a control section and an output filter. The power train is typically mounted on a metal base that mechanically supports and heat sinks the power circuitry. The control and conditioning circuitry is typically mounted on a circuit board that is mounted above the power train.

In some power supplies, a number of power supply modules are ganged together to provide manufacturing flexibility. For example, a 1000 watt power supply may be constructed by coupling four 250 watt power modules together. Typically, each of the modules includes the aforementioned power train and control and conditioning circuitry. Therefore, the input filter, bias supply, control section and output filter are provided for each module in addition to the power train, increasing the cost of the power supply, its size and complexity, while at the same time decreasing its reliability. Moreover, because each module or power supply unit incorporates its own control and conditioning circuitry proximate its power circuitry, heat and noise generated by the power circuitry is passed on to the control circuitry.

Another problem arises in the art of power supplies generally because the manufacturing or fabrication technology used to construct the power train generally differs from that used to construct the control and conditioning circuitry. For example, much thicker copper traces are required in the power train than are desirable for the control section of the control circuitry. Accordingly, power supply systems, including power supply modules for use in a modular power supply, have typically required an additional manufacturing process to integrate the different circuits, resulting in higher cost.

In most applications of the modularized power supply, the outputs of the modules must be synchronized to properly share the output current. In those instances, additional control is required at the system level, further increasing the size, cost and complexity of the power supply. Moreover, there are limits to the amount of control that the system can have on the modules because of the operation of the module's own control circuits.

The present inventor is aware of a prior art "booster" DC-DC converter module in which the control section is omitted. The booster operates in parallel with another DC-DC converter module that controls itself and the booster. The system addresses, to some extent, some of the problems mentioned above. However, the system does not omit the input and output filters at the booster level, so that size and manufacturing cost of the system is not reduced to the extent possible, and the system does not provide for controlling the booster modules independently, which prevents the implementation of some strategies that optimize current sharing among the boosters.

Accordingly, there is a need for a modular power supply that provides for decreased complexity, manufacturing cost and size, and increased reliability, and that provides for increased control of the modules.

SUMMARY OF THE INVENTION

The modular power supply of the present invention solves the aforementioned problems and meets the aforementioned needs by providing a plurality of power supply modules and a system control circuit for controlling the power supply modules. Each power supply module has a power circuit coupled to a power input of the module for receiving an input power current and produces an output power current at a power output of the module. The power circuits each include at least one switching element for switching the input power current or the output power current of a module. The power circuits further include a control circuit input that is coupled directly to the respective said switching device. The system control circuit has a control circuit output bus for connecting to the control circuit inputs of each of the power modules and provides a respective control signal to each module for directly controlling the respective switching devices.

Preferably, the power circuits each include at least one sensing element for sensing a condition of the input power current or the respective said output power current of each module. For this purpose, the power circuits further include a control circuit output that is coupled directly to the respective sensing elements for providing a respective sense signal to said system control circuit. The system control circuit then further includes a control circuit input bus for connecting to the respective control circuit outputs of each of the power modules which directly receives the signals from the modules.

Therefore, it is a principal object of the present invention to provide a novel and improved modular power supply.

It is another object of the present invention to provide a modular power supply that provides for decreased manufacturing cost.

It is still another object of the present invention to provide a modular power supply that provides for decreased complexity.

It is yet another object of the present invention to provide a modular power supply that provides for decreased size.

It is a further object of the present invention to provide a modular power supply that provides for increased reliability.

It is still a further object of the present invention to provide a modular power supply that provides for increased control of the individual modules in the power supply.

The foregoing and other objects, features and advantages of the present invention will be more readily understood upon consideration of the following detailed description of the invention, taken in conjunction with the following drawings.

BRIEF DESCRIPTION OF THE DRAWINGS

FIGS. 1–16 are found in the inventor's prior application, Ser. No. 09/310,627 as incorporated by reference herein.

DETAILED DESCRIPTION OF A PREFERRED EMBODIMENT

Figure 17:
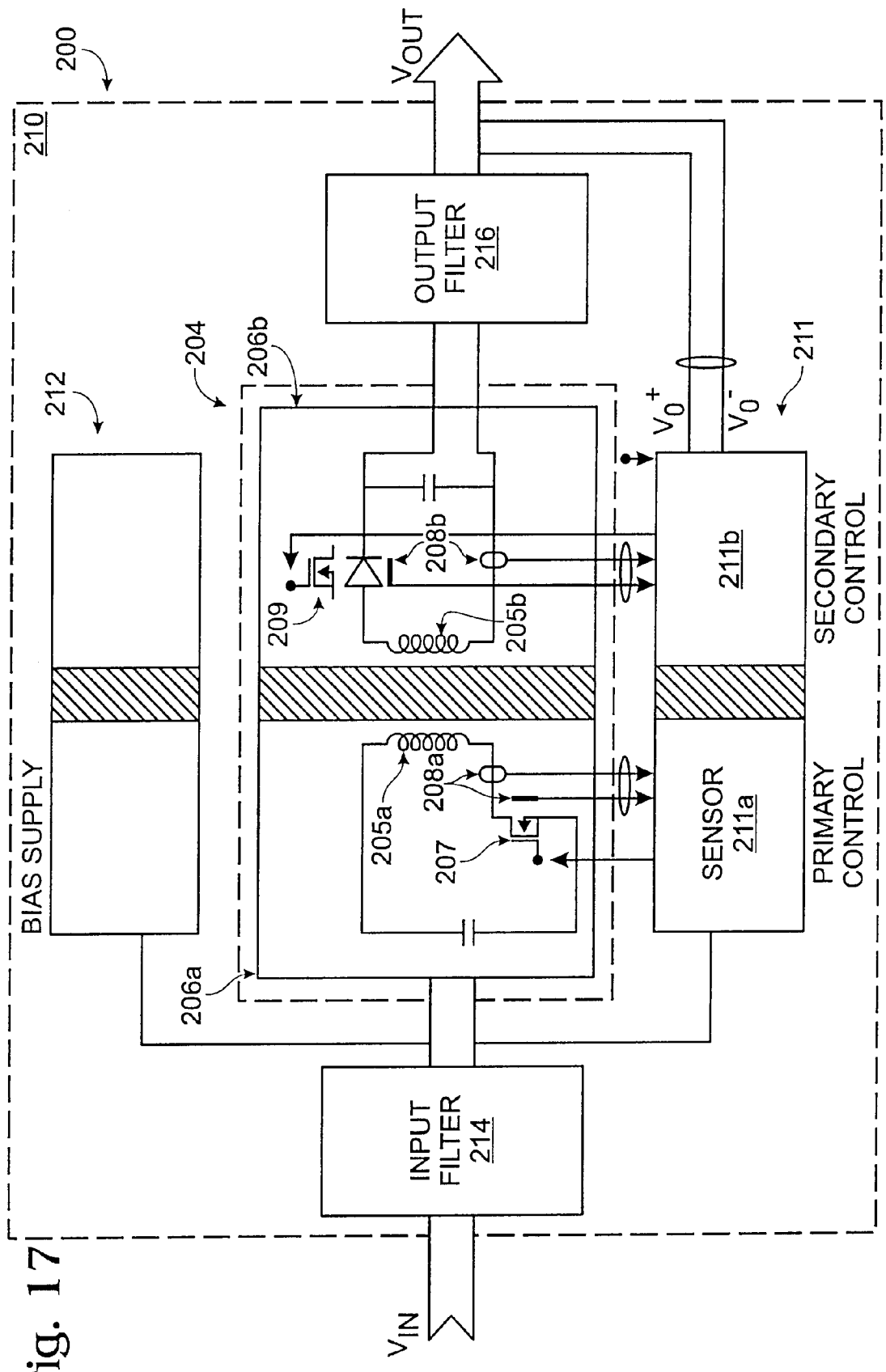
FIG. 17 is a schematic of a prior art module for a modularized power supply.

FIG. 17 shows a prior art module 200 for use in a prior art modular power supply. A power train 204 includes a primary section 206a and a secondary section 206b. The primary section 206a includes the primary 205a of a power transformer 205, switching devices 207, such as power BJTs, FETs or IGBTs and sensors 208a for sensing the input current and the temperature of the switching devices. The secondary section 206b includes the secondary 205b of the power transformer, switching elements 209 such as FETs, diodes and synchronous rectifiers, and sensors 208b for sensing the output current and the temperature of the switching elements.

A control and conditioning circuit 210 is also provided to control the power train 204. The control and conditioning circuit 210 includes a control section 211 having a primary control portion 211a which receives data from the sensors 208a and controls the switching devices 207, and a secondary control portion 211b which receives data from the sensors 208b and controls the switching devices 209.

To provide for operation of the module 200, the control and conditioning circuit 210 further includes a bias supply 212 for supplying the control section 211, and conditioning circuitry including an input filter 214 to smooth the input voltage Vin, and an output filter 216 to ensure that noise in the output voltage Vout does not exceed a predetermined level. As mentioned previously, the power train 204 is typically manufactured with one technology and mounted on one kind of substrate, such as a metal base plate, and the control and conditioning circuit 210 is typically manufactured with another technology and is mounted on a different kind of substrate, such as a printed circuit board.

Figure 18:
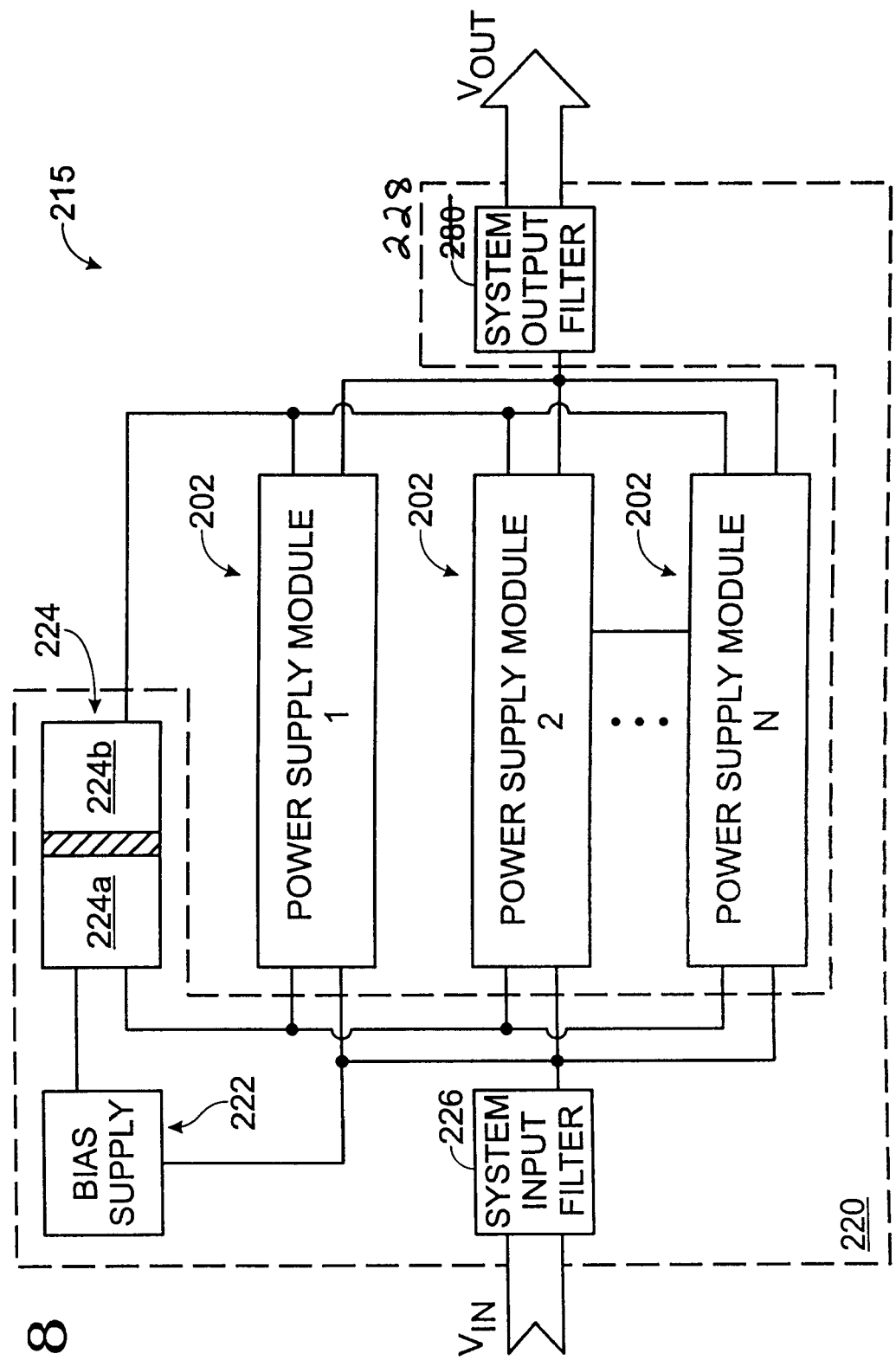
FIG. 18 is a schematic of a prior art power supply system employing a plurality of the modules of FIG. 17.

Turning to FIG. 18, a prior art modular power supply 215 is shown employing a plurality of the modules 202 connected in parallel. The supply 215 includes a system control and conditioning circuit 220 including a system bias supply 222, a system control section 224, a system input filter 226 and a system output filter 228. Like the control section 211, the control section 224 includes a primary control section 224a and a secondary control section 224b. Similarly, the system bias supply 222 and the system input and output filters have an analogous function in the power supply 215 that the corresponding elements have in the module 202. However, as mentioned previously, the system control and conditioning circuit 220 may only control the modules 202 within limits, because the control and conditioning circuit 220 must act through the local control and conditioning circuits 210 of the modules.

Figure 19:
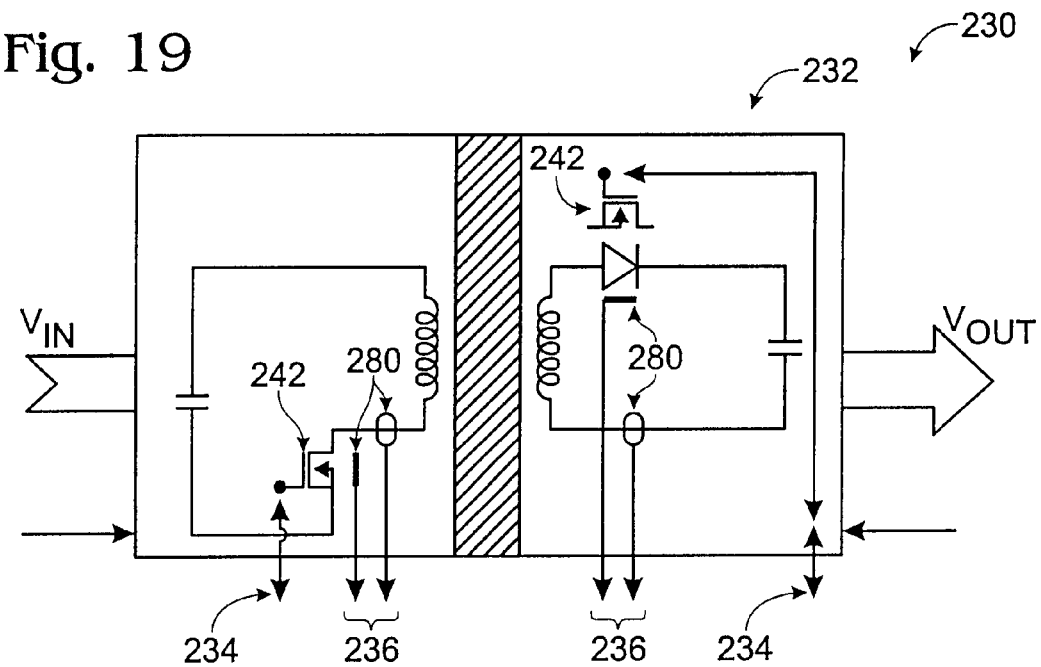
FIG. 19 is a schematic of module for a modularized power supply according to the present invention.

Turning to FIG. 19, a power module 230 according to the present invention is shown. The power module 230 may be described as a "bare" power module because it includes a power train 232, control inputs 234 and sensor outputs 236 for communicating with an external system control and conditioning circuit, but does not have a control and conditioning circuit of its own. The modules 230 provide "direct" connections between at least the control inputs 234 and the underlying switching elements 242, meaning herein that the couplings are not moderated by an intervening control circuit for controlling the switching elements as in the prior art. For example, direct control may be obtained through intervening buffers and driver circuits, but not through circuits that would provide for independent control of the duty cycle of the switching elements.

Figure 20:
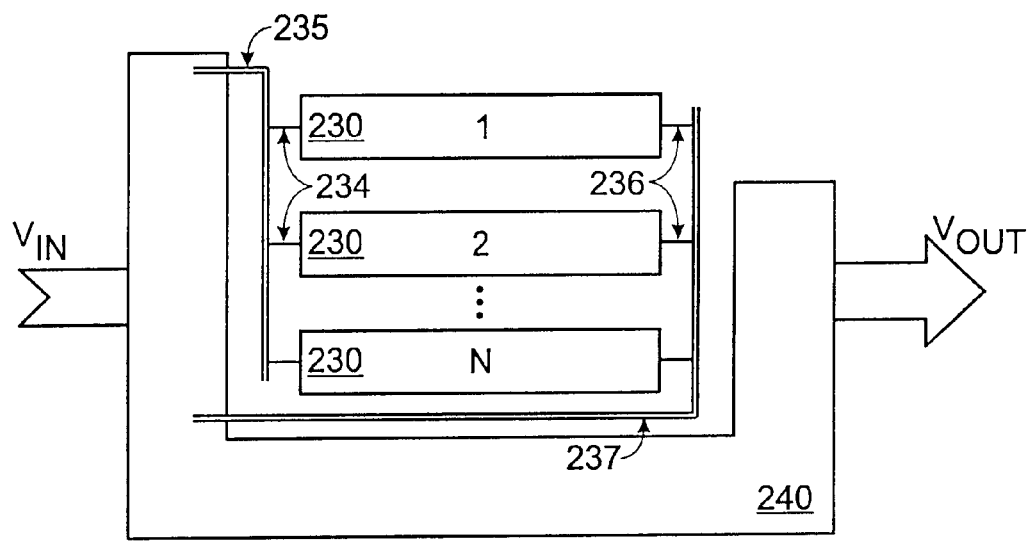
FIG. 20 is a schematic of a power supply system according to the present invention employing a plurality of the modules of FIG. 19.

To operate the module 230, a system control and conditioning circuit 240 similar to the control and conditioning circuit 220 is provided for a plurality of the modules 230. Turning to FIG. 20, the system control and conditioning circuit 240 has a control circuit output bus 235 for communicating with the respective control inputs 234 and thereby directly controlling the switching elements of each module. Preferably as well, the modules 230 provide direct connections between the sensor outputs 236 and underlying sensors 280 of the modules, and a control circuit input bus 237 is provided for communicating with the respective sensor outputs 236 to obtain a similar elimination of intermediate layers of control.

Figure 1:
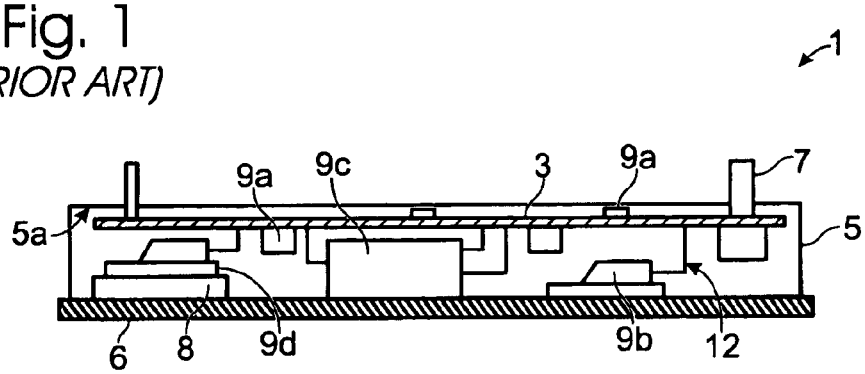
Figure 2:
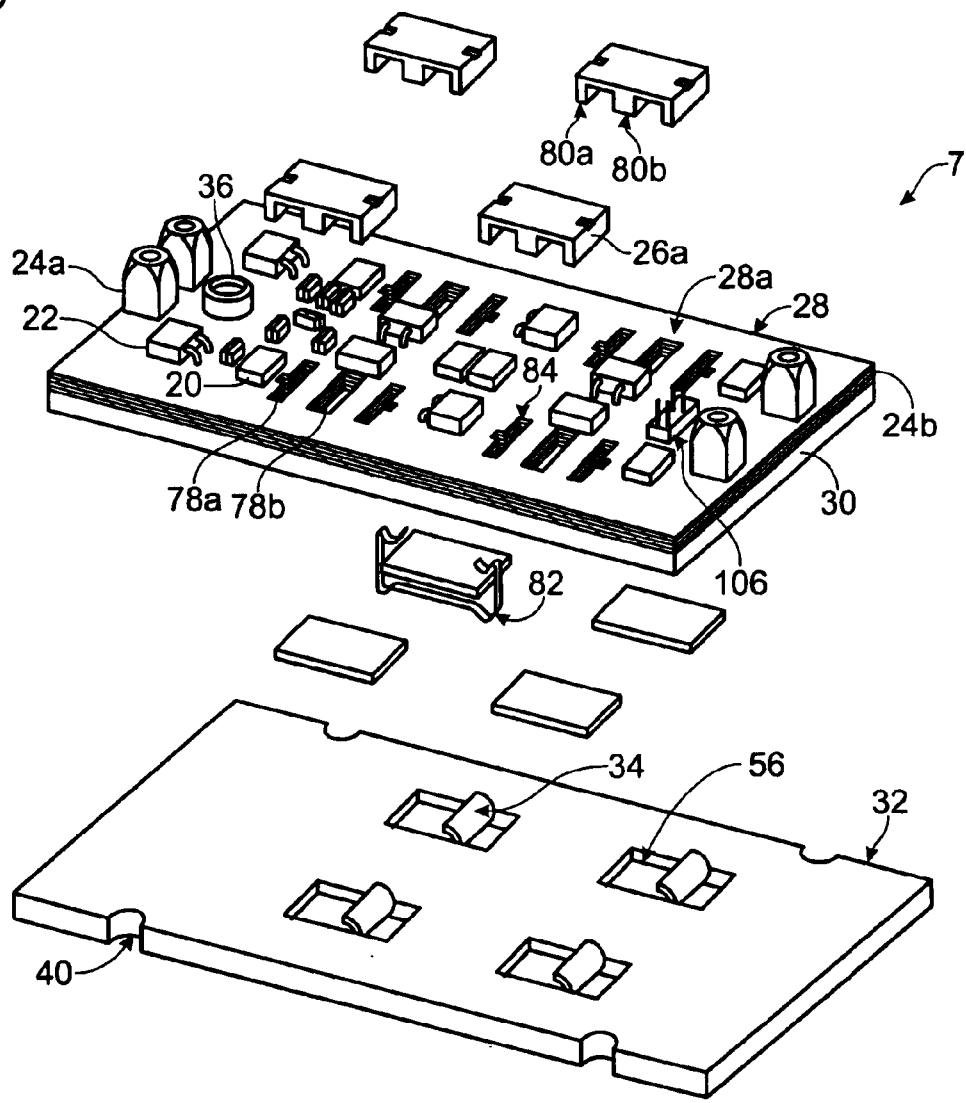
Figure 3A:
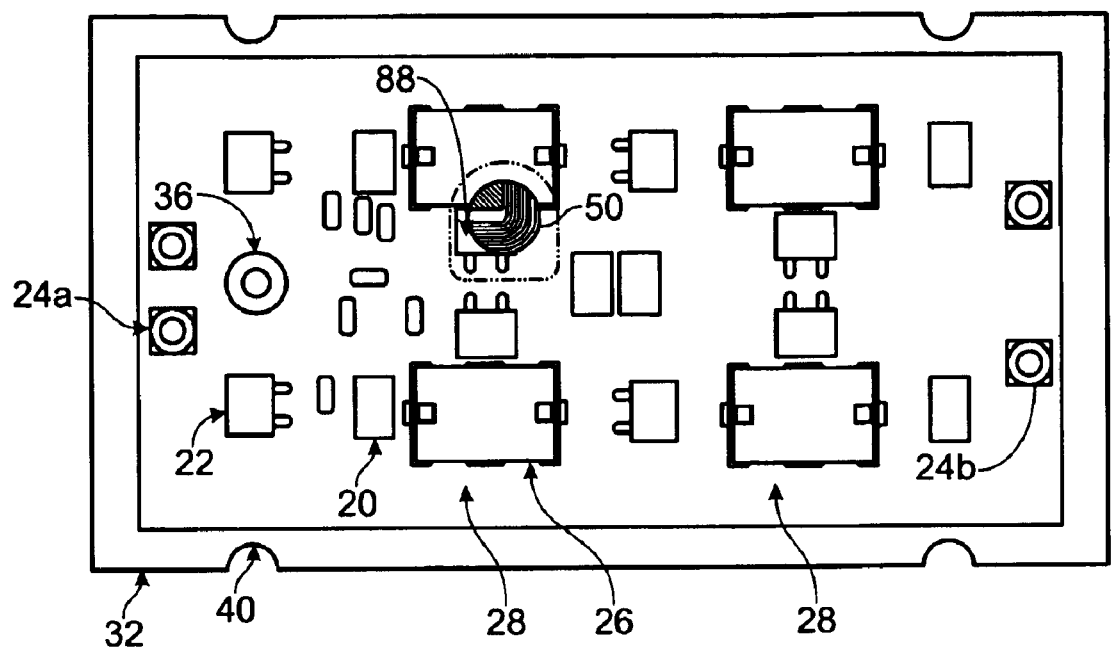
Figure 3B:
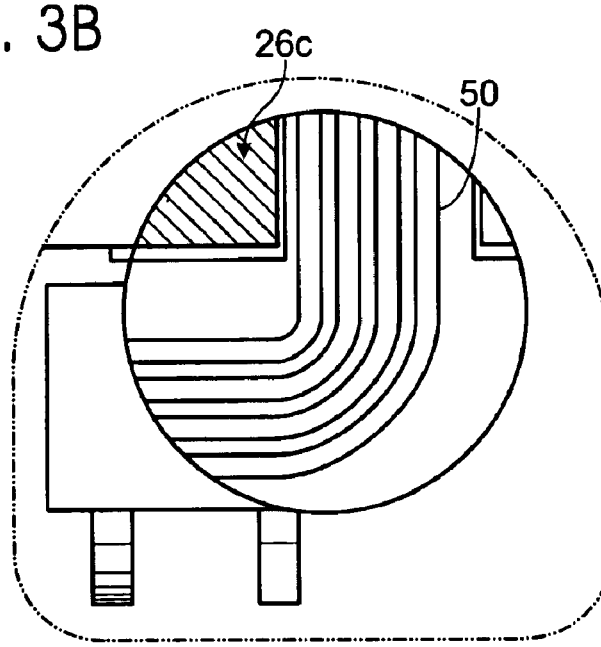
Figure 4A:
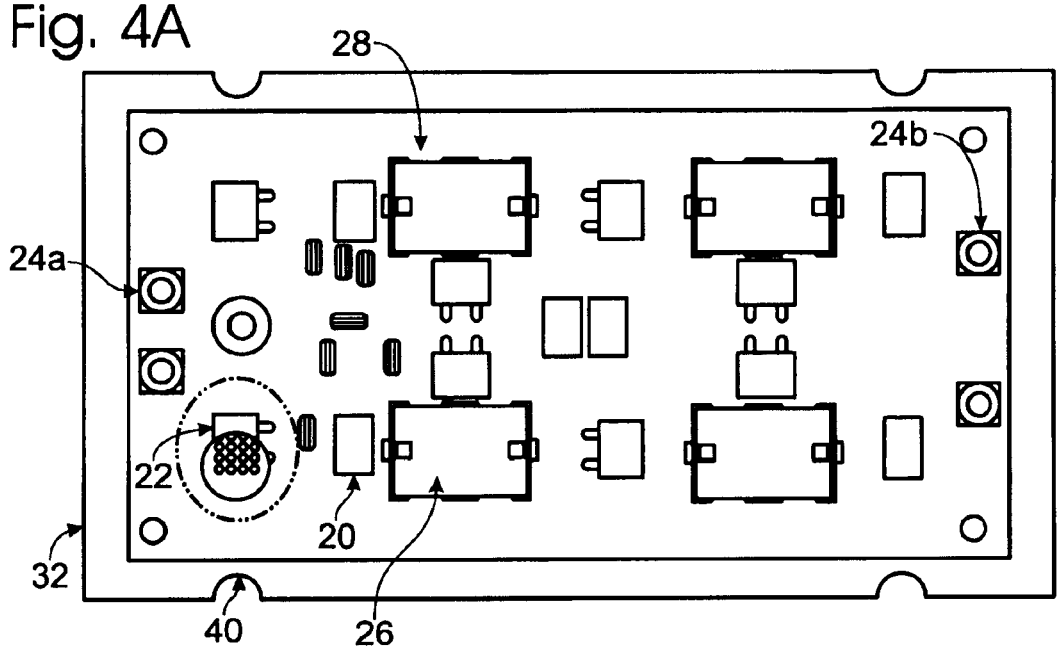
Figure 4C:
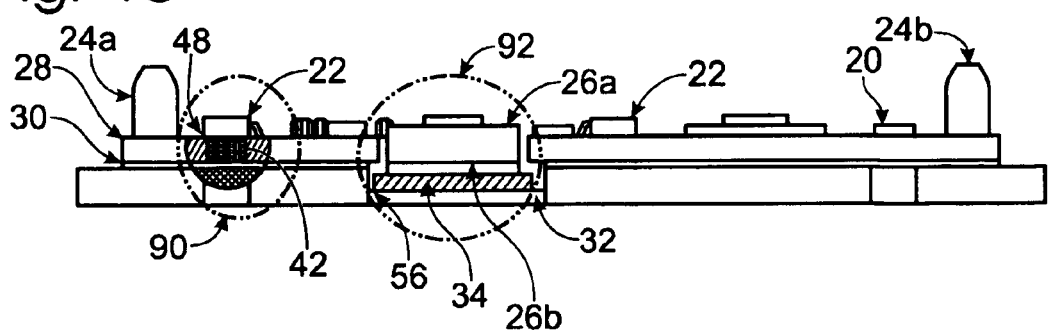
Figure 4B:
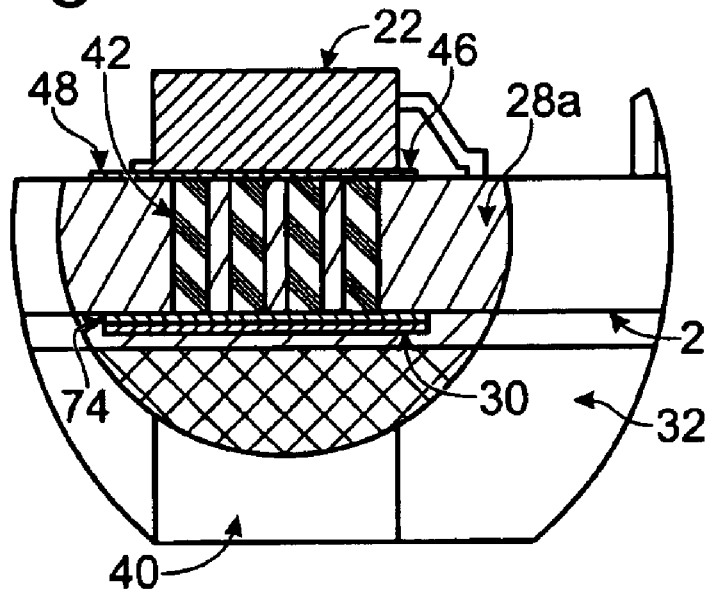
Figure 4D:
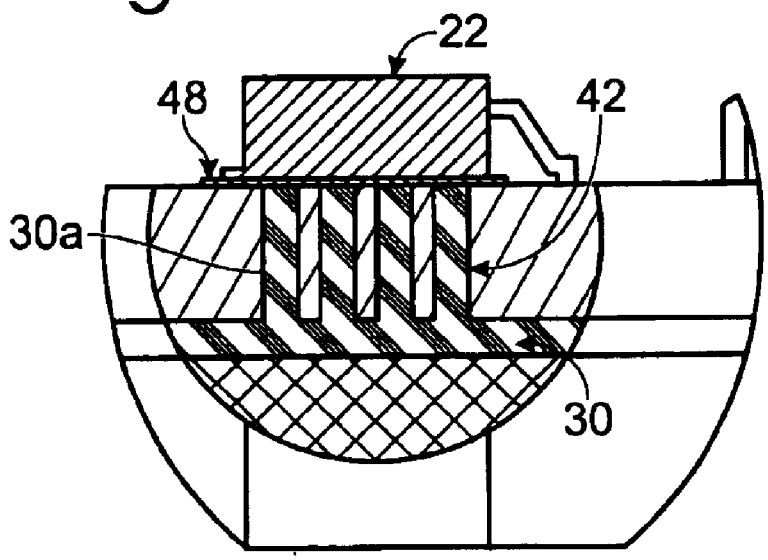
Figure 5A:
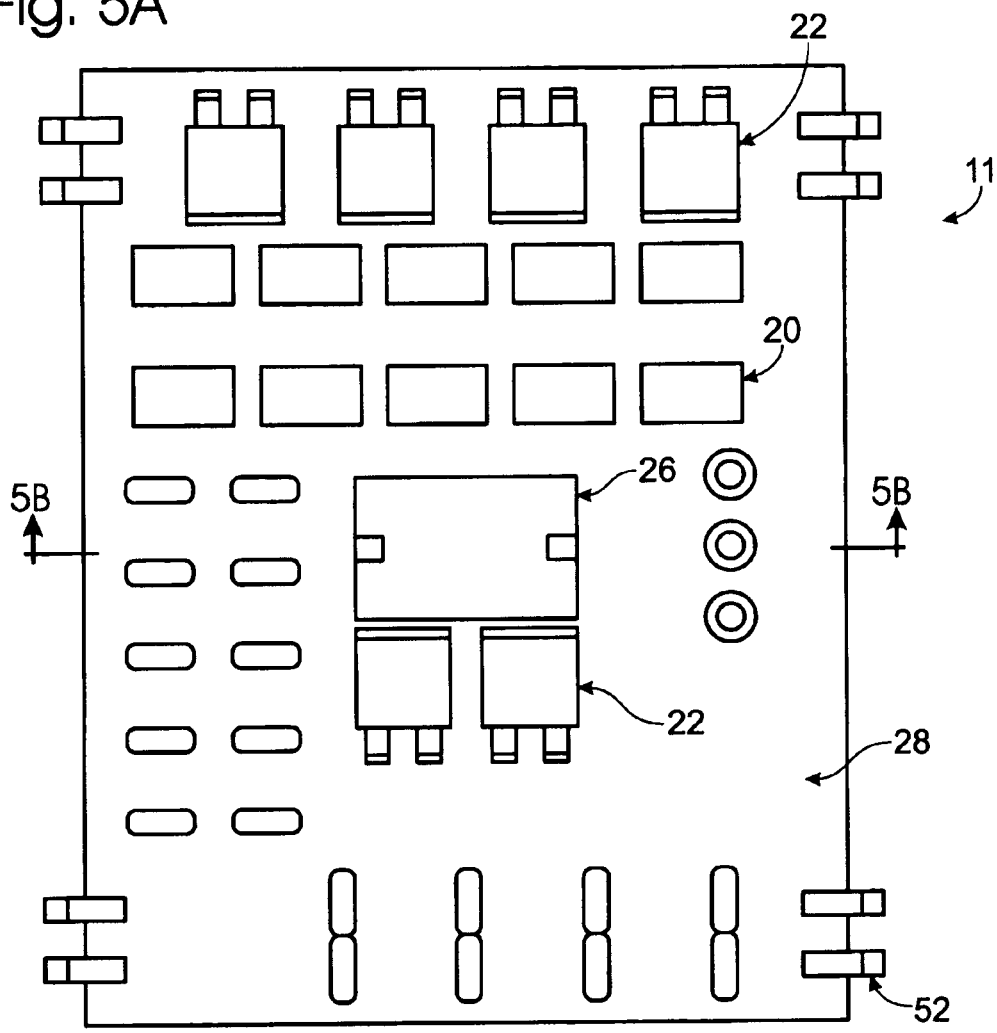
Figure 5B:
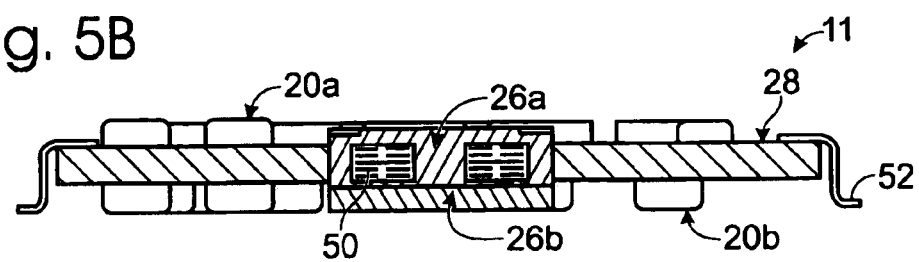
Figure 6:
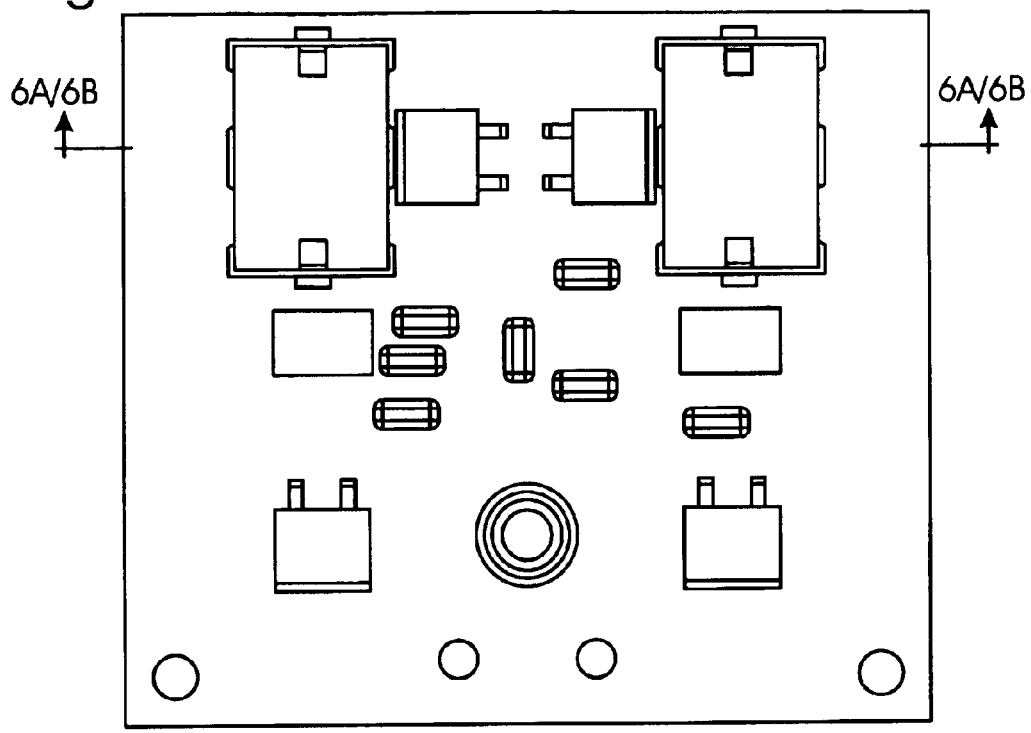
Figure 6A:
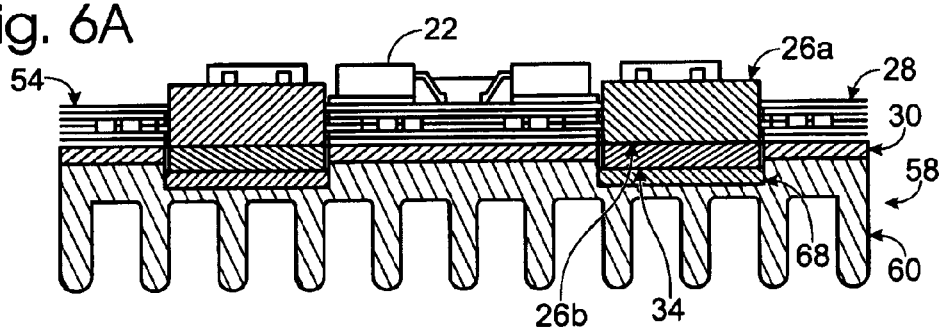
Figure 6B:
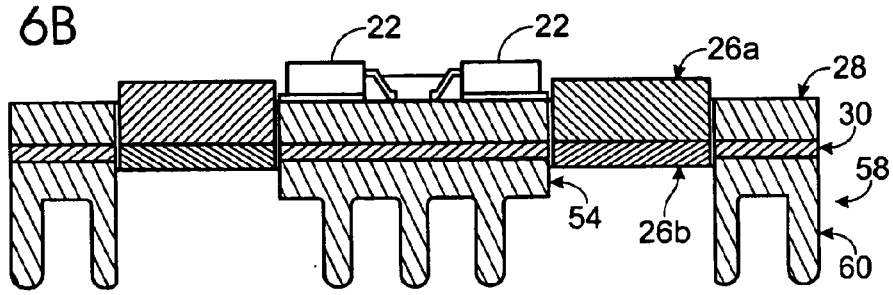
Figure 7A:
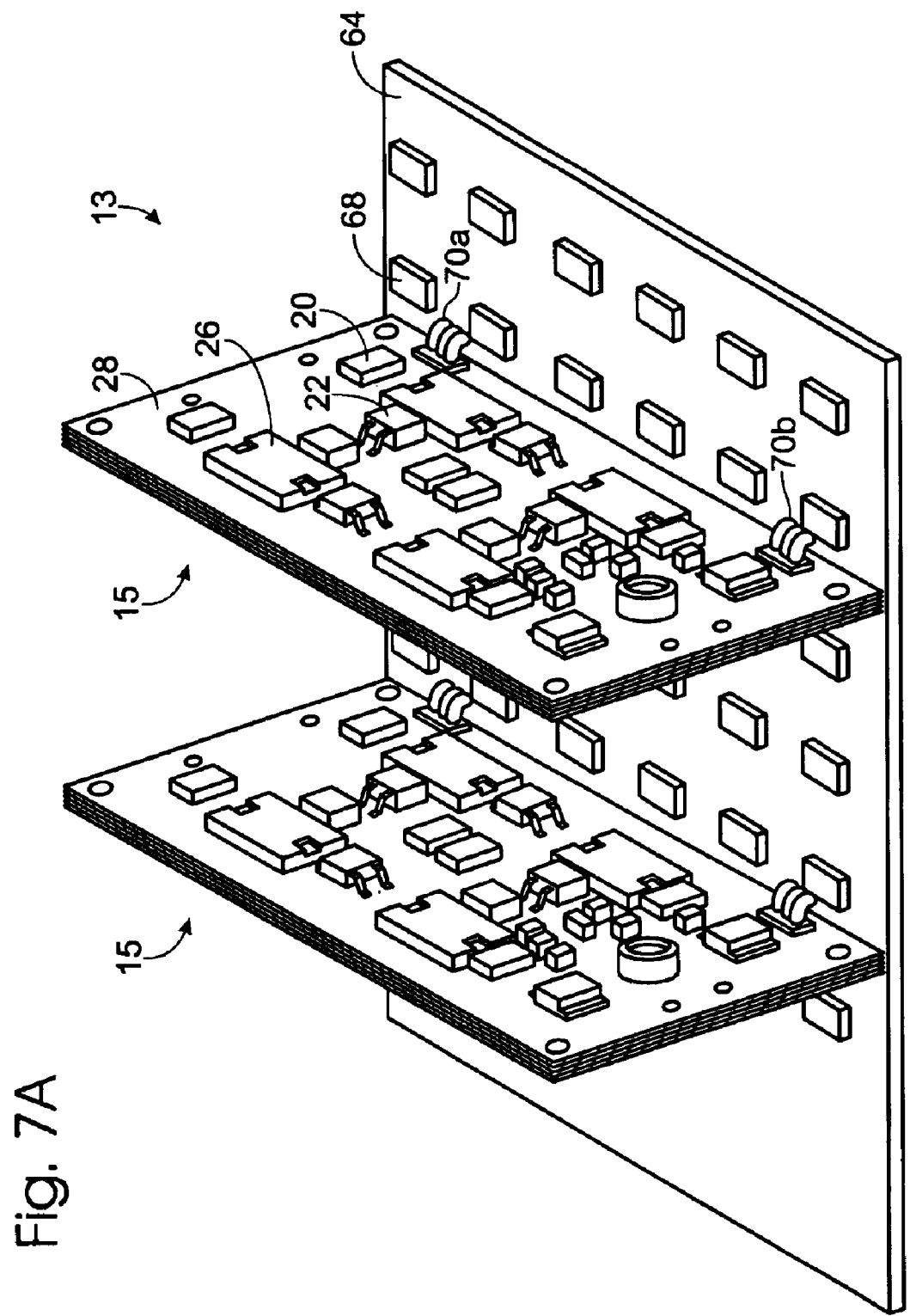
Figure 7B:
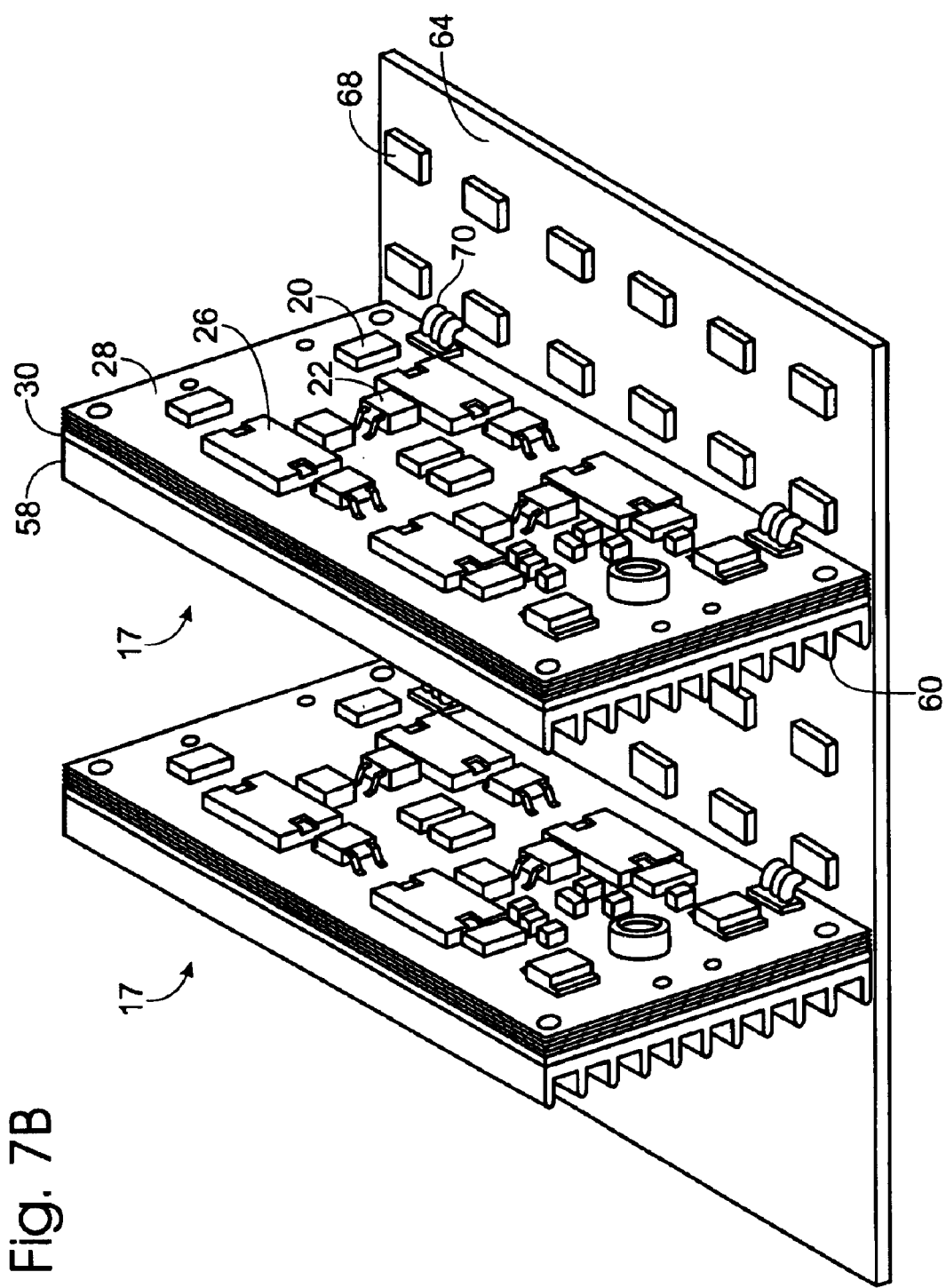
Figure 8:
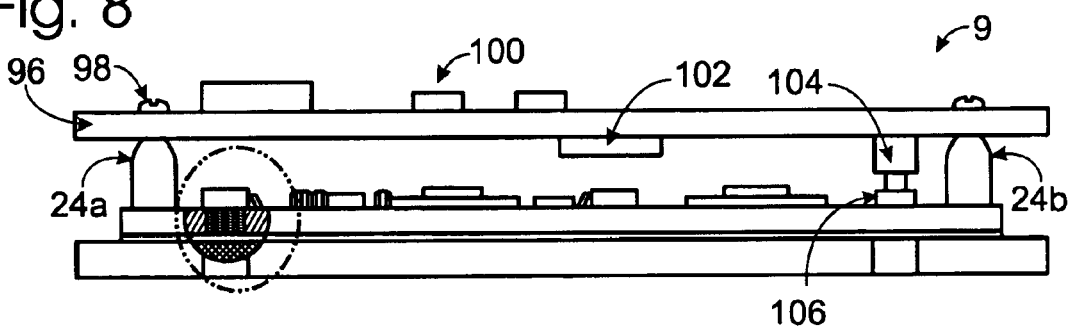
Figure 9:
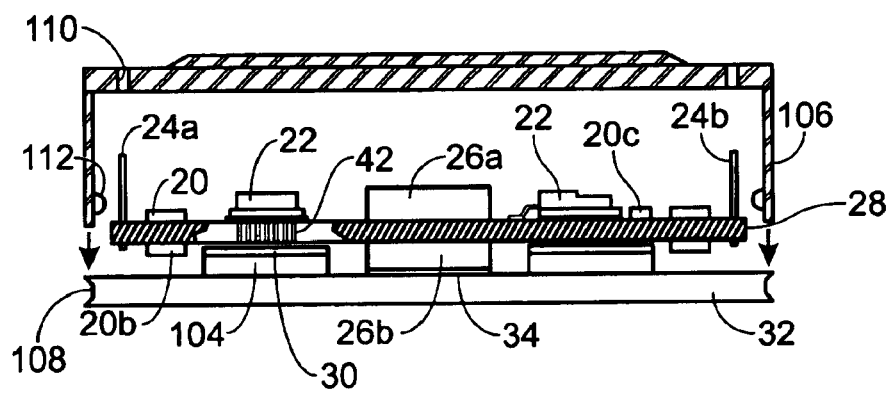
Figure 10A:
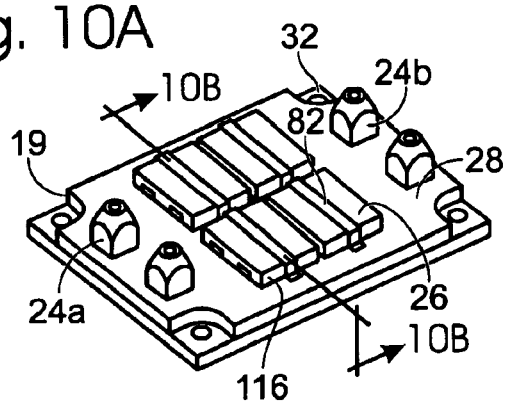
Figure 10B:
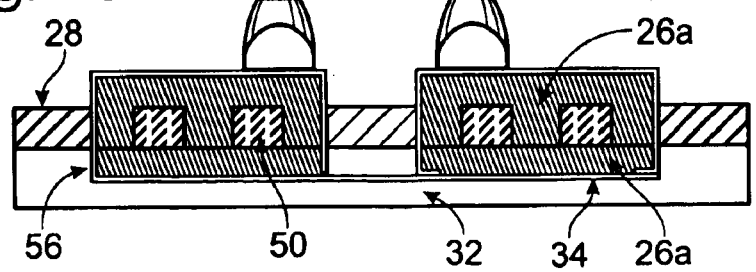
Figure 15:
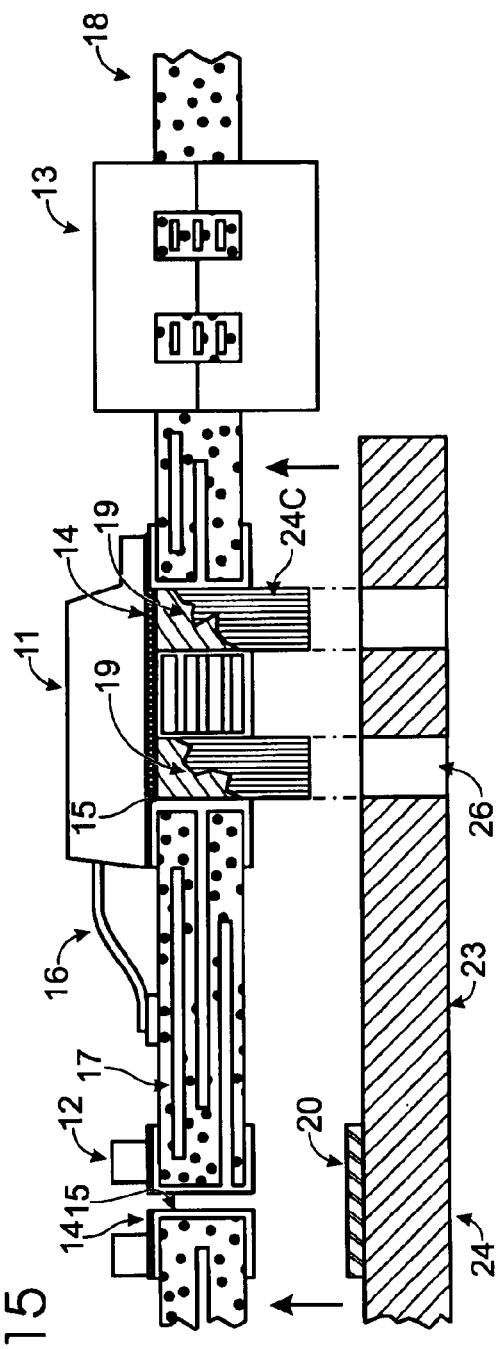
Figure 16:
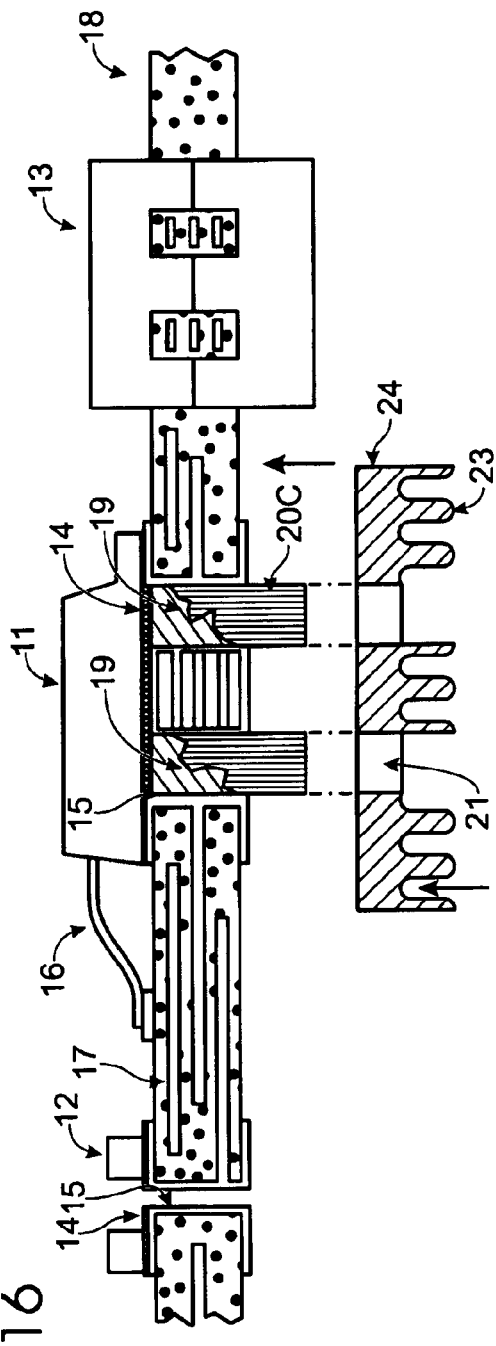
Figure 21:
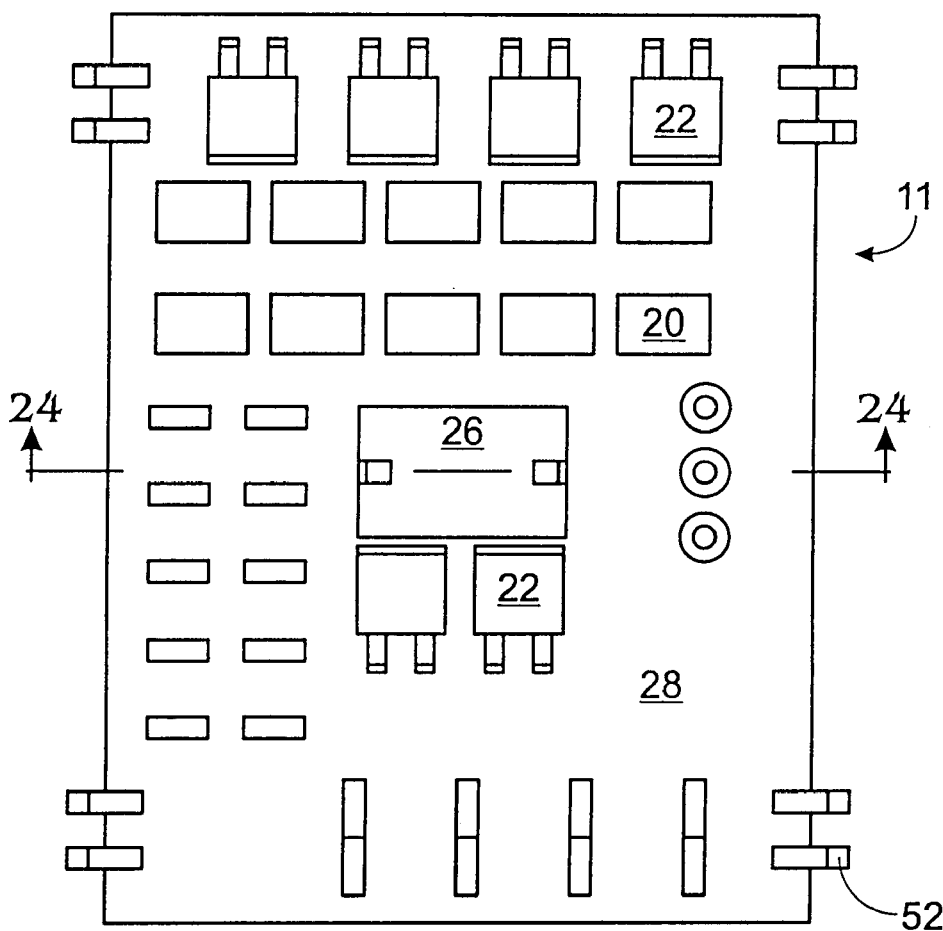
FIG. 21 is a top view of a first package for power electronic components employing airflow cooling for use with the present invention.
Figure 24:
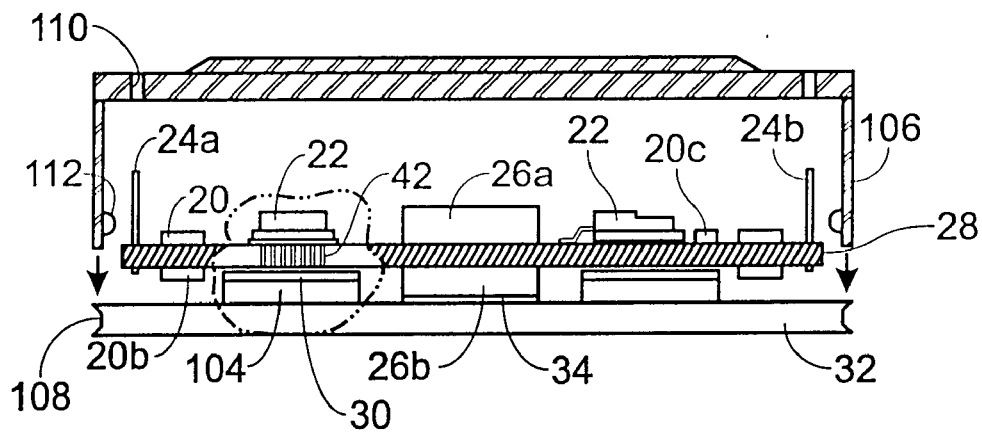
FIG. 24 is a cross-section of a fourth package for power electronic components providing for enhanced thermal conductivity for use with the present invention.
Figure 22:
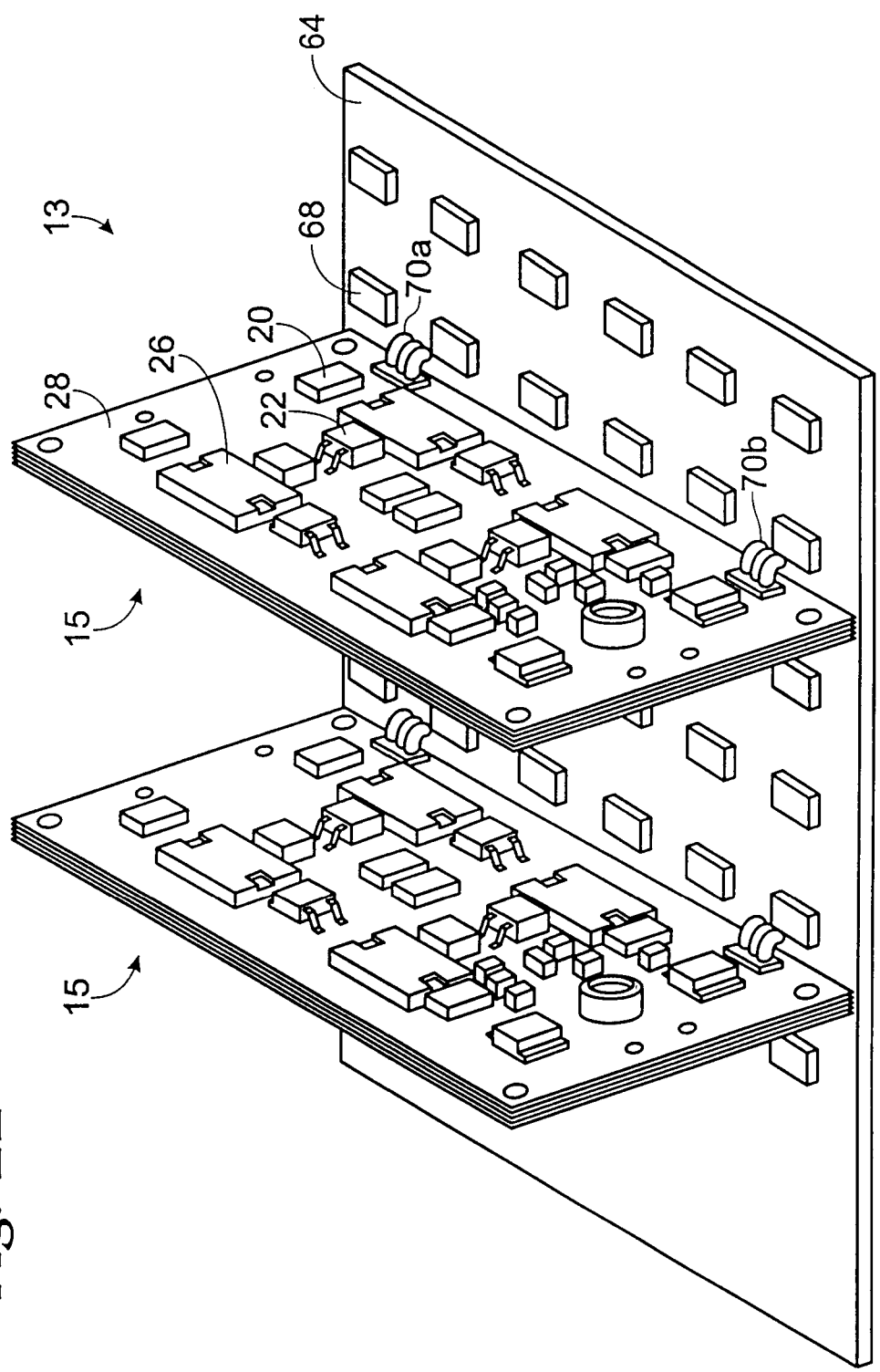
FIG. 22 is a pictorial view of a second package for power electronic components employing airflow cooling for use with the present invention.
Figure 23:
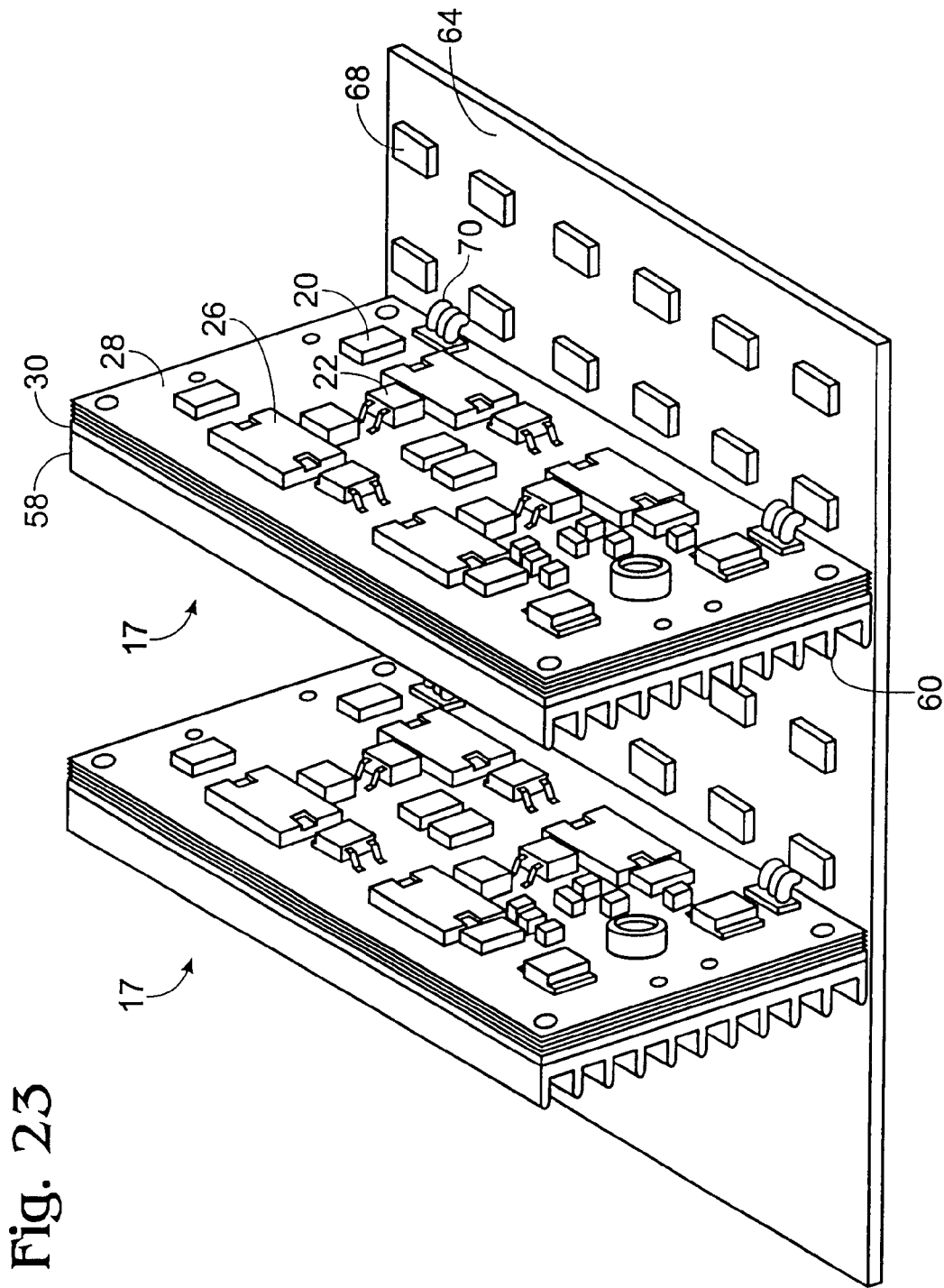
FIG. 23 is a pictorial view of a third package for power electronic components employing airflow cooling for use with the present invention.

Each of the power modules 230 are preferably provided with enhanced thermal characteristics as described in application Ser. No. 09/310,627. For example, referring to FIG. 21, which reproduces FIG. 5A of that application, airflow cooling may be used for the modules 30 in the manner of the PCB 28. Referring to FIG. 22, which reproduces FIG. 7A of application Ser. No. 09/310,627, a motherboard 64 may be used for the system control circuit 240, while the modules 30 may be installed in the manner of the structures 15. Referring to FIG. 23, which reproduces FIG. 7B of application Ser. No. 09/310,627, an additional heat sink may be attached to the modules 30 in the manner of the heat sink 58. Referring to FIG. 24, which reproduces FIG. 9 of application Ser. No. 09/310,627, the modules 30 may be attached to a thermally conductive base in the manner of the PCB 28, thermally conductive insulator 30 and metal plate 32.

Direct system control of "bare" power modules according to the present invention provides for a number of advantages. Fundamentally, it provides that the modules may be controlled to a higher degree, without the limitations imposed by internal control circuits therein, and that the modules may be controlled independently of one another, providing for greatly increased flexibility. A few illustrations of this flexibility are given below, and others will be readily apparent to persons of ordinary skill in light thereof.

As an example of providing a higher degree of control for each module, the direction of power flow may be changed between the primary and secondary by the system control circuit without the limitations imposed by intermediate control circuits that have heretofore been required at the module level. The power transfer can be modulated as desired, and control of the voltage and current for the modules can be tailored as needed.

As an example of providing independent control of the modules, the modules may be interleaved or sequenced by the system control circuit. This method can be used, for example, to increase the input and output ripple frequency of the system as a whole, which permits reducing the size and cost of the input and output filters. In the prior art, input and output filters are provided in the modules themselves, so that no reduction in size or cost of the filters as a result of operation of the modules is possible.

As yet another example, in operation at light load, the system control circuit may turn off selected power modules and process the power with a selected subset of the power modules, increasing the efficiency of light load operation of the system as a whole by eliminating the requirement to control all of the power modules. The amount of power processed by each module may be otherwise sequenced, balanced or distributed to suit environmental or other conditions of the modules, such as their temperature for optimizing cooling of the system as a whole.

All of this flexibility in control may be enhanced by employing programmable, digital control in the system control circuit, and such programmable control may further provide for easy customization of the power processing system, either in manufacturing or by the end-user.

The "bare" modules also have a significantly reduced complexity and therefore have lower cost and greater reliability. Space and cost are also reduced by eliminating redundancy. The system control circuit 220 is preferably located at a distance from the heat and noise producing modules, and this is made possible by eliminating the local control circuits provided in the prior art modules.

It is to be recognized that, while a particular modular power supply has been shown and described as preferred, other configurations and methods could be utilized, in addition to those already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

What is claimed is:

1. A modular power supply, comprising:
    a plurality of power supply modules, each power supply module having a power circuit coupled to a power input of the module for receiving an input power current and for producing an output power current at a power output of the module, said power circuits each including at least one switching element for switching the respective said input power current or the respective said output power current, said power circuits each further including a control circuit input that is coupled directly to the respective said switching element; and
    a system control circuit for controlling said power supply modules, said system control circuit having a control circuit output bus for connecting to the respective said control circuit inputs of each of said power modules and providing a respective control signal to each said module for directly controlling the respective said switching elements in such manner that said modules may be controlled independently of each other.

2. The device of claim 1, wherein said power circuits each include at least one sensing element for sensing a condition of the respective said input power current or the respective said output power current, said power circuits each further including a control circuit output that is coupled directly to the respective said sensing elements for providing a respective sense signal to said system control circuit, and wherein said system control circuit further includes a control circuit input bus for connecting to the respective said control circuit outputs of each of said power modules and directly receiving said respective sense signals from said modules.

3. The modular power supply of claim 1, wherein said power outputs of said modules are coupled together to provide a power output for the power supply.

4. The modular power supply of claim 2, wherein said power outputs of said modules are coupled together to provide a power output for the power supply.

5. A method for forming a power supply, comprising:
    providing a plurality of power supply modules, each power supply module having a power circuit coupled to a power input of the module for receiving an input power current and for producing an output power current at a power output of the module, said power circuits each including at least one switching device for switching the respective said input power current or the respective said output power current, said power circuits each further including a control circuit input directly coupled to the respective said switching device;
    providing a system control circuit having a control circuit output bus for connecting to the respective said control circuit inputs of each of said power modules; and
    directly controlling the respective said switching devices by providing respective control signals for controlling each of said modules on said control circuit output bus independently of one another.

6. The method of claim 5, further comprising providing each said power circuits with at least one sensing element for sensing a condition of the respective said input power current or the respective said output power current, providing each said power circuits with a control circuit output that is coupled directly to the respective said sensing elements for providing a respective sense signal to said system control circuit, providing said system control circuit with a control circuit input bus for connecting to the respective said control circuit outputs of each of said power modules, and directly receiving said respective sense signals from said modules.

7. The method of claim 5, further comprising providing a system input filter having a power input and a power output coupled to each of the power inputs of said modules, sequencing said power modules to increase the ripple frequency of the current through said power input of said system input filter, and providing the size of said system input filter to be smaller than would be required without said step of sequencing.

8. The method of claim 5, wherein said step of providing said system control circuit includes providing programmable control thereof, the method further comprising the steps of programming said system control circuit to provide a program of output currents from said modules, and subsequently reprogramming said system control circuit to provide a different program of output currents from said modules.

9. The method of claim 5, further comprising coupling the power outputs of the modules together to provide a power output for the power supply.

10. The method of claim 6, further comprising coupling the power outputs of the modules together to provide a power output for the power supply.

11. The method of claim 7, further comprising coupling the power outputs of the modules together to provide a power output for the power supply.

12. The method of claim 8, further comprising coupling the power outputs of the modules together to provide a power output for the power supply.

* * * * *